United States Patent [19]
Nakamura et al.

[11] Patent Number: 5,797,388
[45] Date of Patent: Aug. 25, 1998

[54] WIRE-BONDING APPARATUS AND METHOD USING A COVERED WIRE

[75] Inventors: Osamu Nakamura, Kokubunji; Kazumasa Sasakura, Musashimurayama, both of Japan

[73] Assignee: Kabushiki Kaisha Shinkawa, Tokyo, Japan

[21] Appl. No.: 755,784

[22] Filed: Nov. 25, 1996

[30] Foreign Application Priority Data

Nov. 24, 1995 [JP] Japan ................... 7-329523

[51] Int. Cl.$^6$ ........................................ H01L 21/60
[52] U.S. Cl. .............. 228/180.5; 228/4.5; 219/56.21; 219/56.22
[58] Field of Search ................. 228/4.5, 180.5; 219/56.21, 56.22

[56] References Cited

U.S. PATENT DOCUMENTS

| | | | |
|---|---|---|---|
| 5,176,310 | 1/1993 | Akiyama et al. | 228/4.5 |
| 5,370,300 | 12/1994 | Okumura | 228/4.5 |

FOREIGN PATENT DOCUMENTS

| | | | |
|---|---|---|---|
| 2-146742 | 6/1990 | Japan | 219/56.21 |
| 2-213146 | 8/1990 | Japan | 228/4.5 |

*Primary Examiner*—Patrick Ryan
*Assistant Examiner*—Jeffrey T. Knapp
*Attorney, Agent, or Firm*—Koda & Androlia

[57] ABSTRACT

In a wire-bonding machine and method that uses a covered wire, discharge electrodes comprise a pair of discharge electrodes for covering-film removal, in which the upper and lower surfaces of electromagnetic parts used as discharge terminals are held by two insulating parts, and a discharge electrode for ball formation, which is movable together with one of the pair of discharge electrodes for covering-film removal. The discharge electrodes for covering-film removal are positioned so as to be in close proximity to, but not in contact with, the side surfaces of the portion of the covered wire corresponding to an intended second bonding point during the removal of the covering-film from the portion corresponding to the intended second bonding point, and the discharge electrode for ball formation is positioned to one side of the covered wire when the discharge electrodes for covering-film removal are opened, and when the capillary is raised to the ball formation level, the tip of the covered wire is positioned to one side of the discharge electrode for ball formation.

2 Claims, 3 Drawing Sheets

FIG. 3(a) FIG. 3(b) FIG. 3(c) FIG. 3(d)
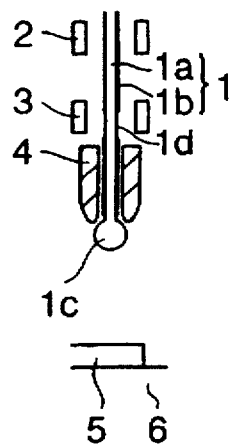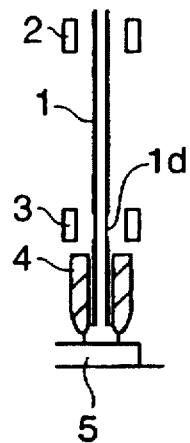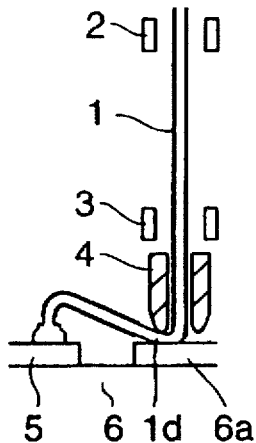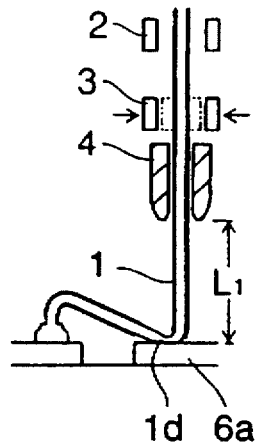
FIG. 3(e) FIG. 3(f) FIG. 3(g)
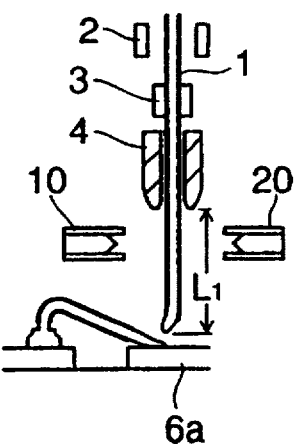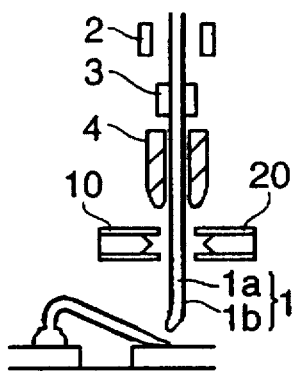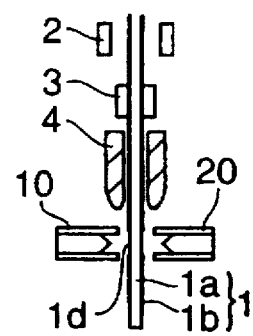
FIG. 3(h) FIG. 3(i) FIG. 3(j) FIG. 3(k)
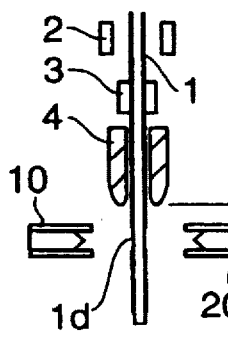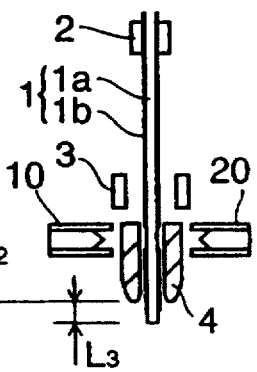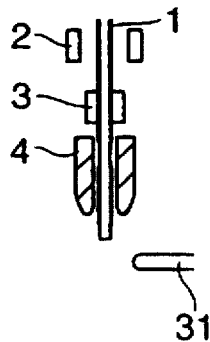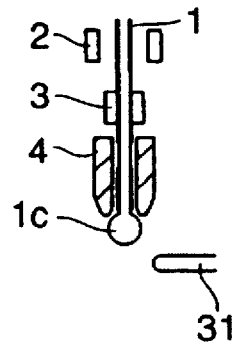

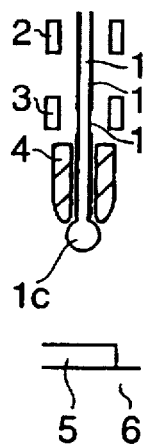
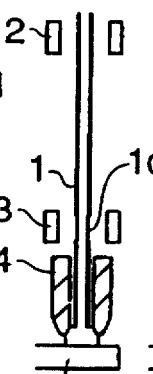
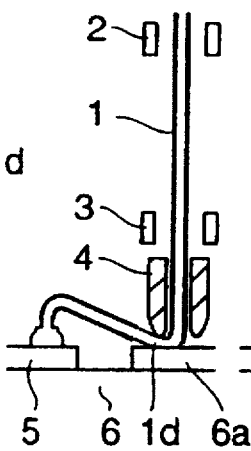
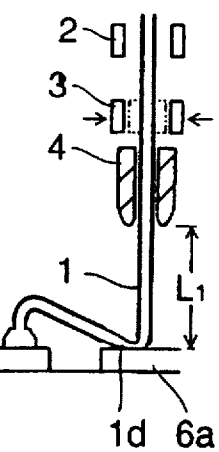
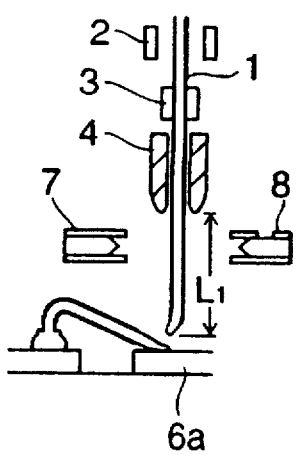
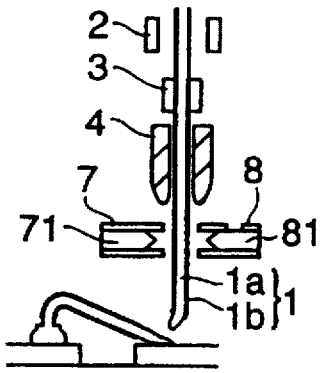
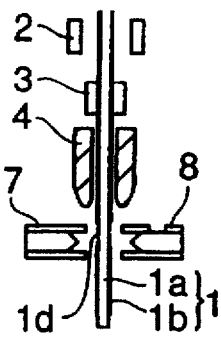
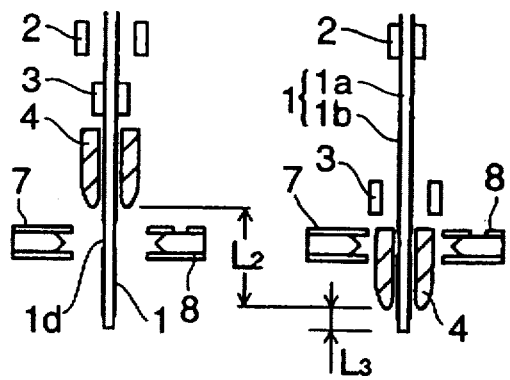
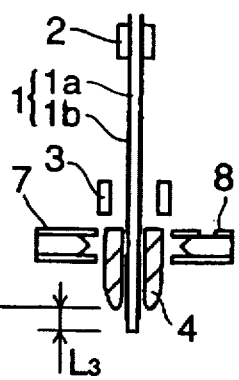
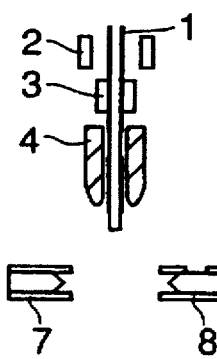
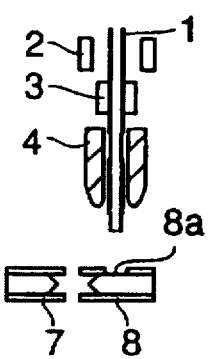
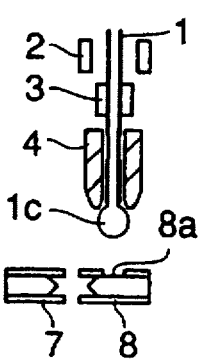
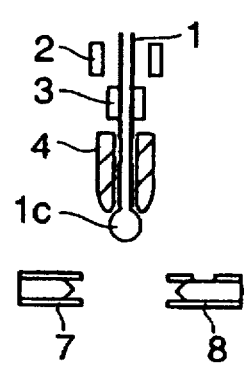
FIG. 4(a) PRIOR ART
FIG. 4(b) PRIOR ART
FIG. 4(c) PRIOR ART
FIG. 4(d) PRIOR ART
FIG. 4(e) PRIOR ART
FIG. 4(f) PRIOR ART
FIG. 4(g) PRIOR ART
FIG. 4(h) PRIOR ART
FIG. 4(i) PRIOR ART
FIG. 4(j) PRIOR ART
FIG. 4(k) PRIOR ART
FIG. 4(l) PRIOR ART
FIG. 4(m) PRIOR ART

5,797,388

WIRE-BONDING APPARATUS AND METHOD USING A COVERED WIRE

BACKGROUND OF THE INVENTION

1. Field of the Invention

The present invention relates to a wire bonding apparatus and method which uses a covered wire.

2. Prior Art

As disclosed in, for example, Japanese Patent Application Laid-Open No. 2-213146, wire bonding methods which use a covered wire include: a covering-film removal process, in which a predetermined portion of a covering-film that covers positions for a second bonding and ball formation is removed beforehand so as to expose a core wire, and a ball formation process, in which a ball is formed at the tip of the wire from which the covering-film has been removed. The covering-film removal process and the ball formation process are performed by discharge electrodes.

FIG. 2 shows conventional wire bonding electrodes used for a covered wire, and FIG. 4 illustrates a conventional wire bonding method that uses a covered wire. As shown in FIG. 4, the covered wire 1 is comprised of a core wire 1a, which is a conductor, and a covering-film 1b, which consists of a macromolecular resin material with electrical insulating properties and is covered as a coating around the circumference of the core wire 1a. The covered wire 1 is supplied from a wire spool, which is not shown in the Figures, and passed through a capillary 4 via a second clamper 2, which is for holding the wire, and a first clamper 3, which is for cutting the wire. The covered wire 1 thus passing through the capillary 4 is connected to the pad of a semiconductor pellet 5 and the lead 6a of a lead frame 6.

As shown in FIG. 2, a pair of discharge electrodes 7 and 8 include electromagnetic parts 71 and 81 as discharge terminals, and the upper and lower surfaces of the electromagnetic parts 71 and 81 are held by insulating parts 72 and 82 which have electrical insulating properties. Here, one of the discharge electrodes 7 is used exclusively for removing the covering-film 1b, while the other discharge electrode 8 functions as a dual-purpose electrode so that it is used both for removing the covering-film 1b and for forming a ball. The upper surface of the discharge electrode 8 has a structure provided with an exposed discharge surface, and this exposed portion functions as an electrode surface 8a for forming a ball.

Next, the wire bonding method that uses the covered wire will be described with reference to FIG. 4. FIG. 4 (a) shows a state in which a ball 1c has been formed at the tip of the covered wire 1, and the first clamper 3 and second clamper 2 are opened. Furthermore, a removed portion (exposed portion 1d) has been formed beforehand by a method which will be described below in an area extending for a predetermined distance from the tip of the covered wire 1. As seen from FIGS. 4 (a) to 4(b), the capillary 4 is lowered so that the ball 1c is bonded to the first bonding point of a pad 5a of the semiconductor pellet 5. Next, the capillary 4 is raised, moved to a point above one of the leads 6a of the lead frame 6 and then lowered; and as shown in FIG. 4(c), the exposed portion 1d is bonded to the second bonding point of the lead 6a.

Next, as shown in FIG. 4 (d), the capillary 4 is raised by a distance $L_1$ from the surface of the lead 6a. This distance $L_1$ is calculated by use of information concerning the first and second bonding positions and the initial set conditions of the bonding apparatus, etc., as described in Japanese Patent Application Laid-Open No. 2-213146. When the capillary 4 is thus raised by a distance $L_1$, the first clamper 3 closes and holds the covered wire 1. Next, with the first clamper 3 closed, the clamper 3 is raised together with the capillary 4; and as shown in FIG. 4(e), the covered wire 1 is cut from the root of the second bonding point. As result, the covered wire 1 protrudes from the tip of the capillary 4 by the length $L_1$, and a part of the exposed portion 1d remains at the tip of the covered wire 1.

Next, as shown in FIG. 4 (f), the pair of discharge electrodes 7 and 8 are moved in close to the covered wire 1 from both sides in a non-contact state. A voltage is then applied to the discharge electrodes 7 and 8 so that an electric discharge is caused to take place between the electromagnetic parts 71 and 81 and the core wire 1a with the covering-film 1b in between. As a result of the discharge energy, as shown in FIG. 4 (g), a portion of the covering-film 1b located at a predetermined position on the covered wire 1 is removed. In other words, the exposed portion 1d shown in FIG. 4 (a) is formed. Next, as shown in FIG. 4 (h), the discharge electrodes 7 and 8 are withdrawn in a direction away from the covered wire 1.

Next, as shown in FIG. 4 (i), the second clamper 2 is closed, and the first clamper 3 is opened. Afterward, the capillary 4 is lowered, in relative terms, by a distance $L_2$ from the state shown in FIG. 4 (h). In this case, since the covered wire 1 is held (restrained) by the second clamper 2, the covered wire 1 is pulled into the interior of the capillary 4 by a distance $L_2$, so that the tip of the covered wire 1 protrudes from the tip of the capillary 4 by a tail length $L_3$. In this case, the tail length $L_3$ of the tip of the covered wire 1 corresponds to a part of the exposed portion 1d, from which the covering-film 1b has been removed.

With this state, the first clamper 3 is closed and the second clamper 2 is opened, and the capillary 4 is raised to a ball forming level as shown in FIG. 4 (j). Next, as shown in FIG. 4 (k), the discharge electrode 8 is moved so that the electrode surface 8a for ball formation is positioned directly beneath the tip of the covered wire 1. Then, as shown in FIG. 4 (l), a high voltage is applied across the discharge electrode 8 and covered wire 1, thus forming the ball 1c. Next, as shown in FIG. 4 (m), the discharge electrode 8 is returned to its original position. Then, the first clamper 3 is opened, and the capillary 4 is positioned above the next bonding point (see FIG. 4 (a)). Afterward, the series of operations shown in FIGS. 4 (a) through 4 (m) are repeated.

In the prior art described above, after the capillary 4 has been raised to the ball forming level as shown in FIG. 4 (j), an operation in which the discharge electrode 8 is moved to a position directly beneath the tip of the covered wire 1, an operation in which ball forming is performed by discharge, and an operation in which the discharge electrode 8 is returned to its original position, are required as shown in FIGS. 4 (k), 4 (l) and 4 (m) in order to form the ball 1c.

SUMMARY OF THE INVENTION

The object of the present invention is to provide a wire bonding apparatus and method which uses a covered wire and in which the ball forming operation performed after the covering-film removing operation is simplified, so that the speed of the bonding operation can be increased, i.e., the productivity of the bonding operation can be improved.

The wire bonding apparatus which uses a covered wire for accomplishing the above-described object is characterized by the fact that in a wire bonding apparatus using a covered wire, a covered wire formed by covering a circumference of a core wire made of a conductive metal with an insulating covering-film and passed through a capillary is used, the covering-film on the portion of the covered wire corresponding to an intended second bonding point is removed and a ball is formed at a tip of the covered wire by discharge electrodes, and the ball formed at the tip portion of the covered wire is joined to a first bonding point, and a covering-film removed portion that is fed out from the capillary is joined to a second bonding point, so that the first bonding point and the second bonding point are electrically connected; wherein the discharge electrodes comprise a pair of discharge electrodes for covering-film removal, in which upper and lower surfaces of electromagnetic parts used as discharge terminals are held by insulating parts, and a discharge electrode for ball formation, which is provided so as to be moved together with one of the pair of discharge electrodes for covering-film removal; the pair of discharge electrodes for covering-film removal are positioned so as to be in close proximity to, but not in contact with, side surfaces of the portion of the covered wire corresponding to the intended second bonding point during removal of the covering-film from the portion corresponding to the intended second bonding point; and the discharge electrode for ball formation is positioned to one side of the covered wire when the discharge electrode for covering-film removal which moves together with the discharge electrode for ball formation is opened, and the tip end of the covered wire is positioned to one side of the discharge electrode for ball formation when the capillary is raised to a ball formation level.

The wire bonding method which uses a covered wire for accomplishing the above-described object is characterized by the fact that in a wire bonding method using a covered wire, a covered wire formed by covering a circumference of a core wire made of a conductive metal with an insulating covering-film and passed through a capillary is used, and a ball formed at the tip portion of the covered wire is joined to a first bonding point, and a covering-film removed portion that is fed out from the capillary is joined to a second bonding point, so that the first bonding point and the second bonding point are electrically connected; wherein the covering-film on the portion of the wire corresponding to an intended second bonding point is removed beforehand by an electric discharge from a pair of discharge electrodes for covering-film removal; a discharge electrode for ball formation is positioned to one side of the covered wire when the pair of discharge electrodes for covering-film removal have been withdrawn from the covered wire; the covered wire is pulled into the interior of the capillary so that the tip of the covered wire remains protruding from the tip of the capillary by a tail length; the capillary is raised to a ball formation level so that the tip of the covered wire is positioned to one side of the discharge electrode for ball formation; and in this state, a ball is formed at the tip of the covered wire by an electric discharge from the discharge electrode for ball formation.

BRIEF DESCRIPTION OF THE DRAWINGS

FIG. 2 shows the discharge electrodes used in a conventional covered-wire wire bonding apparatus, wherein

FIG. 3 shows an explanatory diagram of operations which illustrates one embodiment of the covered-wire wire bonding method of the present invention; and FIG. 4 shows an explanatory diagram of operations which illustrates a conventional covered-wire wire bonding method.

DETAILED DESCRIPTION OF THE INVENTION

Figure 1A:
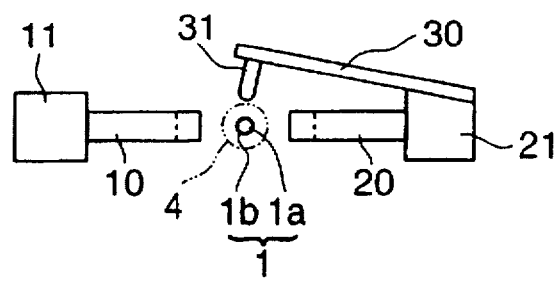
FIG. 1 shows one embodiment of the discharge electrodes used in the covered-wire wire bonding apparatus of the present invention, wherein FIG. 1 (a) is a top view.
FIG. 1(b) is a front view.
Figure 1B:
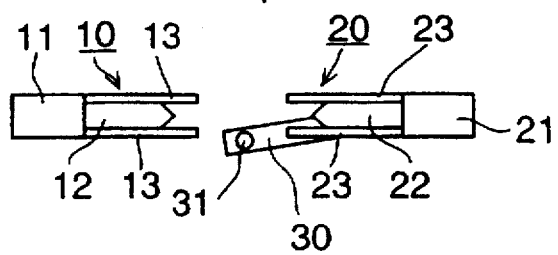

The discharge electrodes used in the covered-wire wire bonding apparatus comprise, as shown in FIG. 1: a pair of discharge electrodes 10 and 20 for covering-film removal in which the upper and lower surfaces of electromagnetic parts 12 and 22 used as discharge terminals are held by two insulating parts 13, 13 and 23, 23; and a discharge electrode 31 for ball formation which is provided so as to move together with one of the pair of discharge electrodes 10 and 20 for covering-film removal. Furthermore, as shown in FIGS. 3 (f) and 3 (g), the pair of discharge electrodes 10 and 20 for covering-film removal are positioned so as to be in close proximity to, but not in contact with, the side surfaces of the portion of the covered wire 1 corresponding to the intended second bonding point during the removal of the covering-film 1b from the portion corresponding to the intended second bonding point; and an exposed portion 1d is formed by an electric discharge caused by the discharge electrodes 10 and 20 for covering-film removal.

The discharge electrode 31, as shown in FIG. 1 (a) .for ball formation moves together with one of the discharge electrodes 20 for covering-film removal and is positioned to one side of the covered wire 1 when the discharge electrodes 10 and 20 used for covering-film removal are opened as shown in FIG. 3 (h). Accordingly, when the capillary 4 is subsequently raised to the ball formation level as shown in FIG. 3 (j), the tip end of the covered wire 1 is positioned to one side of the discharge electrode 31 for ball formation, and a ball 1c is formed by an electric discharge which is caused by the discharge electrode 31 for ball formation. In other words, there is no need to move the discharge electrode 31 used for ball formation in order to form the ball 1c.

In the covered-wire wire bonding method, as shown in FIG. 3 (g), the covering-film 1b on the portion of the wire corresponding to the intended second bonding point is removed beforehand by an electric discharge from the pair of discharge electrodes 10 and 20 for covering-film removal so that an exposed portion 1d is formed. Then, when the pair of discharge electrodes 10 and 20 for covering-film removal are retracted away from the covered wire 1 as shown in FIG. 3 (h), the discharge electrode 31 for ball formation is positioned to one side of the covered wire 1 as shown in FIG. 3 (j). Next, as shown in FIG. 3 (i), the second clamper 2 is opened with the first clamper 3 in a closed state, and the capillary 4 is lowered, resulting in that the tip of the covered wire 1 protrudes from the tip of the capillary 4 by a tail length of $L_3$.

Next, as shown in FIG. 3 (j), the capillary 4 is raised so that the tip of the covered wire 1 is positioned at the ball formation level. In this case, the discharge electrode 31 for ball formation is positioned to one side of the covered wire 1 as described above; accordingly, the discharge electrode 31 for ball formation is positioned to one side of the tip of the covered wire 1 when the tip of the covered wire 1 is positioned at the ball formation level. In this state, a ball 1c is formed at the tip of the covered wire 1 by an electric discharge caused by the discharge electrode 31 for ball formation as shown in FIG. 3 (k). In other words, there is no need to move the discharge electrode 31 for ball formation in order to form the ball 1c.

Figure 2A:
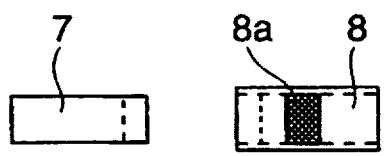
FIG. 2(a) is a top view.
Figure 2B:
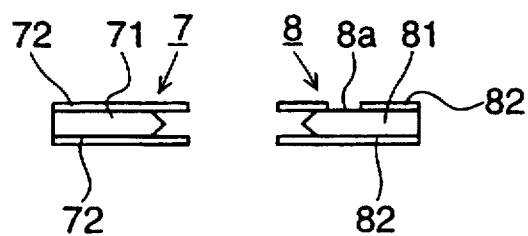
FIG. 2(b) is a front view.

An embodiment of the present invention will be described with reference to FIGS. 1 and 3. Elements which are the same as in FIGS. 2 and 4 or correspond to elements in FIGS. 2 and 4 will be labeled with the same reference numerals. FIG. 1 shows the discharge electrodes used in the covered-wire wire bonding apparatus. A pair of discharge electrodes 10 and 20 are fastened to respective electrode arms 11 and 21 and are driven toward and away from the covered wire 1 by a driving means which is not shown in the Figures. The discharge electrodes 10 and 20 have electromagnetic parts 12 and 22 as discharge terminals, and the upper and lower surfaces of these electromagnetic parts 12 and 22 are held by insulating parts 13, 13 and 23, 23. Conventionally, as shown in FIG. 2, an electrode surface 8a for ball formation, which is an exposed discharge surface, is formed on the upper surface of one of the discharge electrodes 8. However, in the discharge electrodes 10 and 20 of this embodiment, no such electrode surface 8a for ball formation is formed. In other words, the pair of discharge electrodes 10 and 20 are used exclusively for removing the covering-film 1b. Below, the discharge electrodes 10 and 20 will be referred to as "discharge electrodes for covering-film removal".

An electrode arm 30 is fastened to one of the electrode arms 20, and a discharge electrode 31 for ball formation is installed at the tip portion of the electrode arm 30. The discharge electrode 31 for ball formation is provided so as to be positioned to one side of the covered wire 1 at the time the discharge electrodes 10 and 20 are moved away from the covered wire 1 by a certain distance, for example, approximately 0.9 mm from the center of the covered wire 1 when the radius of the capillary 4 is 0.8 mm.

Next, the covered-wire wire bonding method will be described with reference to FIG. 3. Since FIGS. 3 (a) through 3 (e) are identical to FIGS. 4 (a) through 4 (e), a description of the processes illustrated in these Figures are omitted. Though FIGS. 3 (f) through 3 (i) are almost identical to FIGS. 4 (f) through 4 (i), the processes illustrated in these FIGS. will be described briefly. Once the covered wire 1 is cut at the area corresponding to the second bonding point (i.e., at the exposed portion 1d) as shown in FIG. 3 (e), the pair of discharge electrodes 10 and 20 for covering-film removal are moved in close to the covered wire 1 in a non-contact state from both sides as shown in FIG. 3 (f); then, as shown in FIG. 3 (g), a voltage is applied to the discharge electrodes 10 and 20 for covering-film removal so that a portion of the covering-film 1b is, as in the prior art, removed from a prescribed portion of the covered wire 1.

Next, as shown in FIG. 3 (h), the discharge electrodes 10 and 20 for covering-film removal are withdrawn from the covered wire 1 and then caused to return to their original positions. When the discharge electrodes 10 and 20 for covering-film removal return to their original positions, the discharge electrode 31 for ball formation is moved together with the discharge electrodes 10 and 20 for covering-film removal and is positioned to one side of the covered wire 1 as shown in FIG. 1 (a). Next, as shown in FIG. 3 (i), the second clamper 2 is closed and the first clamper 3 is opened; after which the capillary 4 is lowered in relative terms by a distance $L_2$ from the state shown in FIG. 3 (h). As a result, the covered wire 1 is pulled into the interior of the capillary 4 by a distance $L_2$, so that the tip of the covered wire 1 protrudes from the tip of the capillary 4 by a tail length of $L_3$.

In this state, as shown in FIG. 3 (j), the first clamper 3 is closed and the second clamper 2 is opened; and the capillary 4 is then raised to the ball formation level. In the prior art, as shown in FIG. 4 (j), the tip of the covered wire 1 is moved to a point above the ball-formation electrode surface 8a of the discharge electrode 8. In the present embodiment, however, the covered wire 1 is moved until the tip of the covered wire is positioned to one side of the discharge electrode 31 for ball formation. Next, as shown in FIG. 3 (k), a high voltage is applied across the discharge electrode 31 for ball formation and the covered wire 1, so that a ball 1c is formed. Next, the first clamper 3 is opened, and the capillary 4 is positioned above the next bonding point (see FIG. 3 (a)). Afterward, the series of operations shown in FIGS. 3 (a) through 3 (k) are repeated.

In other words, FIG. 3 (j) corresponds to FIG. 4 (j), and FIG. 3 (k) corresponds to FIG. 4 (l). More specifically, in the present embodiment, two operations wherein the discharge electrode 8 is moved to a point beneath the tip of the covered wire 1 and the electrode 8 is returned to its original position from the tip of the covered wire 1, as shown in FIGS. 4 (k) and 4 (m), are not required. Accordingly, the ball formation operation is simplified so that the speed of the bonding operation can be increased and the productivity of the bonding operation can be improved.

The covered-wire wire bonding apparatus and method of the present invention comprise the means described in claims 1 and 2; accordingly, the ball formation operation is simplified so that the speed of the bonding operation can be increased and the productivity of the bonding operation can be improved.

We claim:

1. A wire bonding apparatus which uses a covered wire wherein:

a covered wire formed by covering a circumference of a core wire made of a conductive metal with an insulating covering-film and passed through a capillary is used, the covering-film on the portion of the covered wire corresponding to an intended second bonding point is removed and a ball is formed at a tip of the covered wire by discharge electrodes, and the ball formed at the tip portion of the covered wire is joined to a first bonding point, and a covering-film removed portion that is fed out from the capillary is joined to a second bonding point, so that the first bonding point and the second bonding point are electrically connected, said apparatus being characterized in that:

said discharge electrodes comprise a pair of discharge electrodes for covering-film removal, in which upper and lower surfaces of electromagnetic parts used as discharge terminals are held by insulating parts, and a discharge electrode for ball formation, which is provided so as to be moved together with one of said pair of discharge electrodes for covering-film removal;

said pair of discharge electrodes for covering-film removal are positioned so as to be in close proximity to, but not in contact with, side surfaces of said portion of the covered wire corresponding to the intended second bonding point during a removal of the covering-film from the portion corresponding to the intended second bonding point; and said discharge electrode for ball formation is positioned to one side of the covered wire when the discharge electrode for covering-film removal which moves together with said discharge electrode for ball formation is opened, and the tip end of the covered wire is positioned to one side of the discharge electrode for ball formation when the capillary is raised to a ball formation level.

2. A wire bonding method which uses a covered wire wherein:

a covered wire formed by covering a circumference of a core wire made of a conductive metal with an insulating covering-film and passed through a capillary is used, and a ball formed at the tip portion of the covered wire is joined to a first bonding point, and a covering-film removed portion that is fed out from the capillary is joined to a second bonding point, so that the first bonding point and the second bonding point are electrically connected, said method being characterized in that:

removing the covering-film on a portion of the wire corresponding to an intended second bonding point beforehand by an electric discharge from a pair of discharge electrodes for covering-film removal;

positioning a discharge electrode for ball formation to one side of the covered wire when said pair of discharge electrodes for covering-film removal have been withdrawn from the covered wire;

pulling the covered wire into the interior of the capillary so that the tip of the covered wire remains protruding from the tip of the capillary by a tail length;

raising the capillary to a ball formation level so that the tip of the covered wire is positioned to one side of said discharge electrode for ball formation; and in this state, forming a ball at the tip of the covered wire by an electric discharge from the discharge electrode for ball formation.

* * * * *